(12) United States Patent
Jiang et al.

(10) Patent No.: US 11,480,305 B2
(45) Date of Patent: Oct. 25, 2022

(54) LED TUBE LAMP

(71) Applicant: JIAXING SUPER LIGHTING ELECTRIC APPLIANCE CO., LTD, Jiaxing (CN)

(72) Inventors: Tao Jiang, Jiaxing (CN); Yueqiang Zhang, Jiaxing (CN)

(73) Assignee: Jiaxing Super Lighting Electric Appliance Co., Ltd., Zhejiang (CN)

( * ) Notice: Subject to any disclaimer, the term of this patent is extended or adjusted under 35 U.S.C. 154(b) by 25 days.

(21) Appl. No.: 17/137,743

(22) Filed: Dec. 30, 2020

(65) Prior Publication Data
US 2021/0148521 A1    May 20, 2021

Related U.S. Application Data

(63) Continuation-in-part of application No. 16/823,352, filed on Mar. 19, 2020, now Pat. No. 11,131,431,
(Continued)

(30) Foreign Application Priority Data

Sep. 25, 2014  (CN) .......................... 201410508899.8
Sep. 28, 2014  (CN) .......................... 201410507660.9
(Continued)

(51) Int. Cl.
*F21K 9/27*      (2016.01)
*F21V 19/00*    (2006.01)
(Continued)

(52) U.S. Cl.
CPC .............. *F21K 9/275* (2016.08); *F21K 9/272* (2016.08); *F21K 9/278* (2016.08); *F21V 3/02* (2013.01);
(Continued)

(58) Field of Classification Search
CPC .......... F21K 9/275; F21K 9/272; F21K 9/278; F21V 19/001; F21V 19/009; F21V 23/02;
(Continued)

(56) References Cited

U.S. PATENT DOCUMENTS 7,815,338 B2    10/2010  Siemiet et al.
7,926,975 B2     4/2011  Siemiet
(Continued)

*Primary Examiner* — Vibol Tan
(74) *Attorney, Agent, or Firm* — Muir Patent Law, PLLC

(57) ABSTRACT

An LED tube lamp comprises a heat-dissipating glass lamp tube, protective film attached to a surface of the glass lamp tube, an LED light strip disposed in the glass lamp tube and two end caps, each of the two end caps coupled to a respective end of the glass lamp tube. The LED light strip comprises a substantially flat LED circuit board and a plurality of LED light sources, the LED circuit board comprises a top surface and a base surface, and the plurality of LED light sources mounted on the top surface and the base surface are directly affixed to a curved inner surface of the glass lamp tube. A non-insulating adhesive layer is disposed between the base surface of the LED circuit board and the curved inner surface of the glass lamp tube and extends along a length of the LED light strip. The LED circuit board comprises a first end electrically connecting to a first connector and a second end electrically connecting to a second connector, wherein the first connector and the second connector are connectable to a light fixture through the end caps. The inner space of the glass lamp tube comprises ambient atmosphere. The plurality of LED light sources emit white light. The diameter of the lamp tube is ⅝ inch or 1 inch and a length of the glass lamp tube is 2 ft, 4 ft or 8 ft.

12 Claims, 2 Drawing Sheets

Related U.S. Application Data which is a continuation of application No. 16/420,506, filed on May 23, 2019, now Pat. No. 10,624,160, which is a continuation of application No. 16/026,331, filed on Jul. 3, 2018, now Pat. No. 10,342,078, which is a continuation of application No. 15/888,335, filed on Feb. 5, 2018, now Pat. No. 10,426,003, which is a continuation of application No. 15/643,034, filed on Jul. 6, 2017, now Pat. No. 10,021,742, said application No. 16/026,331 is a continuation of application No. 15/643,034, filed on Jul. 6, 2017, now Pat. No. 10,021,742, which is a continuation-in-part of application No. 15/483,368, filed on Apr. 10, 2017, now Pat. No. 9,945,520, and a continuation-in-part of application No. 15/339,221, filed on Oct. 31, 2016, now Pat. No. 9,939,140, and a continuation-in-part of application No. 15/298,955, filed on Oct. 20, 2016, now Pat. No. 9,845,923, and a continuation-in-part of application No. 15/258,068, filed on Sep. 7, 2016, now Pat. No. 9,723,662, and a continuation-in-part of application No. 15/211,783, filed on Jul. 15, 2016, now Pat. No. 9,885,449, said application No. 15/339,221 is a continuation-in-part of application No. 15/210,989, filed on Jul. 15, 2016, now Pat. No. 9,587,817, said application No. 15/483,368 is a continuation of application No. 15/211,717, filed on Jul. 15, 2016, now Pat. No. 9,618,168, said application No. 15/210,989 is a continuation-in-part of application No. 15/205,011, filed on Jul. 8, 2016, now Pat. No. 9,629,211, said application No. 15/643,034 is a continuation-in-part of application No. 15/205,011, filed on Jul. 8, 2016, now Pat. No. 9,629,211, said application No. 15/211,717 is a continuation-in-part of application No. 15/168,962, filed on May 31, 2016, now Pat. No. 10,634,337, said application No. 15/643,034 is a continuation-in-part of application No. 15/168,962, filed on May 31, 2016, now Pat. No. 10,634,337, and a continuation-in-part of application No. 15/150,458, filed on May 10, 2016, now Pat. No. 9,794,990, said application No. 15/205,011 is a continuation-in-part of application No. 15/150,458, filed on May 10, 2016, now Pat. No. 9,794,990, said application No. 15/211,783 is a continuation-in-part of application No. 15/087,088, filed on Mar. 31, 2016, now Pat. No. 9,879,852, said application No. 15/168,962 is a continuation-in-part of application No. 15/087,092, filed on Mar. 31, 2016, now Pat. No. 10,082,250, said application No. 15/210,989 is a continuation-in-part of application No. 15/066,645, filed on Mar. 10, 2016, now Pat. No. 9,497,821, said application No. 15/643,034 is a continuation-in-part of application No. 15/066,645, filed on Mar. 10, 2016, now Pat. No. 9,497,821, said application No. 15/211,717 is a continuation-in-part of application No. 15/056,121, filed on Feb. 29, 2016, now Pat. No. 9,447,929, said application No. 15/643,034 is a continuation of application No. 15/055,630, filed on Feb. 28, 2016, now Pat. No. 9,781,805, said application No. 15/087,092 is a continuation-in-part of application No. PCT/CN2015/096502, filed on Dec. 5, 2015, said application No. 15/168,962 is a continuation-in-part of application No. PCT/CN2015/096502, filed on Dec. 5, 2015, said application No. 15/066,645 is a continuation-in-part of application No. 14/865,387, filed on Sep. 25, 2015, now Pat. No. 9,609,711, said application No. 15/150,458 is a continuation-in-part of application No. 14/865,387, filed on Sep. 25, 2015, now Pat. No. 9,609,711, said application No. 15/298,955 is a continuation of application No. 14/865,387, filed on Sep. 25, 2015, now Pat. No. 9,609,711, said application No. 15/056,121 is a continuation-in-part of application No. 14/865,387, filed on Sep. 25, 2015, now Pat. No. 9,609,711, said application No. 15/087,088 is a continuation-in-part of application No. 14/865,387, filed on Sep. 25, 2015, now Pat. No. 9,609,711, said application No. 15/150,458 is a continuation-in-part of application No. 14/699,138, filed on Apr. 29, 2015, now Pat. No. 9,480,109, said application No. 15/205,011 is a continuation-in-part of application No. 14/699,138, filed on Apr. 29, 2015, now Pat. No. 9,480,109, said application No. 15/258,068 is a continuation of application No. 14/699,138, filed on Apr. 29, 2015, now Pat. No. 9,480,109.

(30) Foreign Application Priority Data

| Date | | Number |
|---|---|---|
| Oct. 17, 2014 | (CN) | 201420602526.2 |
| Nov. 6, 2014 | (CN) | 201410623355.6 |
| Dec. 5, 2014 | (CN) | 201410734425.5 |
| Feb. 12, 2015 | (CN) | 201510075925.7 |
| Mar. 10, 2015 | (CN) | 201510104823.3 |
| Mar. 25, 2015 | (CN) | 201510133689.X |
| Mar. 26, 2015 | (CN) | 201510134586.5 |
| Mar. 27, 2015 | (CN) | 201510136796.8 |
| Apr. 3, 2015 | (CN) | 201510155807.7 |
| Apr. 14, 2015 | (CN) | 201510173861.4 |
| Apr. 22, 2015 | (CN) | 201510193980.6 |
| May 19, 2015 | (CN) | 201510259151.3 |
| May 22, 2015 | (CN) | 201510268927.8 |
| May 29, 2015 | (CN) | 201510284720.X |
| Jun. 10, 2015 | (CN) | 201510315636.X |
| Jun. 12, 2015 | (CN) | 201510324394.0 |
| Jun. 17, 2015 | (CN) | 201510338027.6 |
| Jun. 26, 2015 | (CN) | 201510364735.7 |
| Jun. 26, 2015 | (CN) | 201510372375.5 |
| Jun. 26, 2015 | (CN) | 201510373492.3 |
| Jun. 29, 2015 | (CN) | 201510378322.4 |
| Jul. 2, 2015 | (CN) | 201510391910.1 |
| Jul. 10, 2015 | (CN) | 201510406595.5 |
| Jul. 20, 2015 | (CN) | 201510428680.1 |
| Jul. 27, 2015 | (CN) | 201510448220.5 |
| Aug. 7, 2015 | (CN) | 201510482944.1 |
| Aug. 8, 2015 | (CN) | 201510483475.5 |
| Aug. 8, 2015 | (CN) | 201510486115.0 |
| Aug. 14, 2015 | (CN) | 201510499512.1 |
| Aug. 26, 2015 | (CN) | 201510530110.3 |
| Sep. 2, 2015 | (CN) | 201510555543.4 |
| Sep. 6, 2015 | (CN) | 201510557717.0 |
| Sep. 18, 2015 | (CN) | 201510595173.7 |
| Sep. 25, 2015 | (CN) | 201510617370.4 |
| Oct. 8, 2015 | (CN) | 201510645134.3 |
| Oct. 10, 2015 | (CN) | 201510651572.0 |
| Oct. 20, 2015 | (CN) | 201510680883.X |
| Oct. 27, 2015 | (CN) | 201510705222.8 |
| Oct. 29, 2015 | (CN) | 201510716899.1 |
| Oct. 29, 2015 | (CN) | 201510724263.1 |
| Oct. 30, 2015 | (CN) | 201510726365.7 |
| Oct. 30, 2015 | (CN) | 201510726484.2 |
| Nov. 27, 2015 | (CN) | 201510848766.X |
| Dec. 2, 2015 | (CN) | 201510868263.9 |
| Dec. 9, 2015 | (CN) | 201510903680.2 |

| Date | Country | Application Number |
|---|---|---|
| Dec. 31, 2015 | (CN) | 201511025998.1 |
| Jan. 22, 2016 | (CN) | 201610044148.4 |
| Jan. 26, 2016 | (CN) | 201610050944.9 |
| Jan. 26, 2016 | (CN) | 201610051691.7 |
| Jan. 28, 2016 | (CN) | 201620089157.0 |
| Feb. 15, 2016 | (CN) | 201610085895.2 |
| Feb. 16, 2016 | (CN) | 201610087627.4 |
| Feb. 23, 2016 | (CN) | 201610098424.5 |
| Mar. 3, 2016 | (CN) | 201610120993.5 |
| Mar. 4, 2016 | (CN) | 201610123852.9 |
| Mar. 4, 2016 | (CN) | 201620165131.X |
| Mar. 9, 2016 | (CN) | 201610132513.7 |
| Mar. 14, 2016 | (CN) | 201610142140.1 |
| Mar. 25, 2016 | (CN) | 201610177706.4 |
| Apr. 22, 2016 | (CN) | 201610256190.2 |
| Apr. 29, 2016 | (CN) | 201610281812.7 |
| May 18, 2016 | (CN) | 201610327806.0 |
| May 27, 2016 | (CN) | 201610363805.1 |
| Jun. 14, 2016 | (CN) | 201610420790.8 |
| Jun. 20, 2016 | (CN) | 201610452437.8 |
| Oct. 8, 2016 | (CN) | 201610876593.7 |

(51) Int. Cl.
- F21K 9/275 (2016.01)
- F21K 9/272 (2016.01)
- F21K 9/278 (2016.01)
- F21V 23/02 (2006.01)
- F21V 3/02 (2006.01)
- F21V 7/00 (2006.01)
- F21V 31/00 (2006.01)
- F21V 3/06 (2018.01)
- F21V 29/83 (2015.01)
- F21Y 115/10 (2016.01)
- F21Y 103/10 (2016.01)

(52) U.S. Cl.
CPC .............. *F21V 3/061* (2018.02); *F21V 7/005* (2013.01); *F21V 19/001* (2013.01); *F21V 19/009* (2013.01); *F21V 23/02* (2013.01); *F21V 29/83* (2015.01); *F21V 31/005* (2013.01); *F21Y 2103/10* (2016.08); *F21Y 2115/10* (2016.08)

(58) Field of Classification Search
CPC .......... F21V 3/02; F21V 7/005; F21V 31/005; F21V 3/061; F21V 29/83; F21V 23/006; F21Y 2115/10; F21Y 2103/10; H05B 45/12; H05B 45/56; H05B 45/3578
See application file for complete search history.

(56) References Cited

U.S. PATENT DOCUMENTS

| | | | |
|---|---|---|---|
| 8,684,566 | B2 | 4/2014 | Bretschneider et al. |
| 8,757,832 | B2 | 6/2014 | Kim |
| 9,234,632 | B2 | 1/2016 | Kawabata |
| 9,464,793 | B2 | 10/2016 | May |
| 9,541,274 | B2 | 1/2017 | Bertram et al. |
| 9,551,480 | B2 | 1/2017 | Speer |
| 9,625,129 | B2 | 4/2017 | Jiang et al. |
| 9,810,384 | B2 | 11/2017 | Yingchun |
| 9,920,887 | B2 | 3/2018 | Wilhelmus et al. |
| 9,945,542 | B2 | 4/2018 | Evitt |
| 9,958,118 | B2 | 5/2018 | Luo et al. |
| 9,989,200 | B2 | 6/2018 | Yingchun |
| 10,697,593 | B2 | 6/2020 | Yingchun |
| 11,262,028 | B2 * | 3/2022 | Janik ............... H05B 45/10 |
| 2007/0103902 | A1 | 5/2007 | Hsiao |
| 2009/0290334 | A1 | 11/2009 | Ivey et al. |
| 2010/0033964 | A1 | 2/2010 | Choi et al. |
| 2010/0157608 | A1 | 6/2010 | Chen et al. |
| 2011/0019421 | A1 | 1/2011 | Lai |
| 2012/0069556 | A1 | 3/2012 | Bertram et al. |
| 2012/0293991 | A1 | 11/2012 | Lin |
| 2013/0033888 | A1 | 2/2013 | Wei |
| 2013/0170196 | A1 | 7/2013 | Huang et al. |
| 2013/0182407 | A1 | 7/2013 | Wu |
| 2013/0207534 | A1 | 8/2013 | Masuda et al. |
| 2013/0229104 | A1 | 9/2013 | Green et al. |
| 2013/0258668 | A1 | 10/2013 | Delian et al. |
| 2014/0009923 | A1 | 1/2014 | Wu et al. |
| 2014/0078771 | A1 | 3/2014 | Chen et al. |
| 2015/0345712 | A1 | 12/2015 | Purdy |
| 2016/0084449 | A1 | 3/2016 | Speer et al. |
| 2016/0091179 | A1 | 3/2016 | Jiang et al. |
| 2016/0305641 | A1 | 10/2016 | Lin et al. |
| 2018/0209593 | A1 | 7/2018 | Luo et al. |

* cited by examiner

LED TUBE LAMP

CROSS-REFERENCE TO RELATED APPLICATIONS

This application is a continuation-in-part application of U.S. application Ser. no. 16/823,352 filed on Mar. 19, 2020 which is a continuation application of U.S. application no. 16/420,506 filed on May 23, 2019 which is a continuation application of U.S. application Ser. no. 16/026,331 filed on Jul. 3, 2018 which is a continuation application of U.S. application Ser. 15/888,335 filed on Feb. 5, 2018.

The U.S. application Ser. No. 15/888,335 is a continuation application of U.S. application Ser. No. 15/643,034 filed on Jul. 6, 2017 which is a continuation-in-part application of U.S. application Ser. No. 15/298,955 filed on Oct. 20, 2016 and issued as U.S. Pat. No. 9,845,923 on Dec. 19, 2017, U.S. application Ser. No. 15/055,630 filed on Feb. 28, 2016, U.S. application Ser. No. 15/339,221 filed on Oct. 31, 2016, U.S. application Ser. No. 15/258,068 filed on Sep. 7, 2016, U.S. application Ser. No. 15/211,783 filed on Jul. 15, 2016, and U.S. application Ser. No. 15/483,368 filed on Apr. 10, 2017, wherein the Ser. No. 15/298,955 application is a continuation application of U.S. application Ser. No. 14/865,387 filed in United States on Sep. 25, 2015, which itself claims Chinese priorities under 35 U.S.C. § 119(a) to Patent Applications No. CN 201410507660.9 filed on 2014 Sep. 28; CN 201410508899.8 filed on 2014 Sep. 28; CN 201410623355.6 filed on 2014 Nov. 6; CN 201410734425.5 filed on 2014 Dec. 5; CN 201510075925.7 filed on 2015 Feb. 12; CN 201510104823.3 filed on 2015 Mar. 11; CN 201510134586.5 filed on 2015 Mar. 26; CN 201510133689.x filed on 2015 Mar. 25; CN 201510136796.8 filed on 2015 Mar. 27; CN 201510173861.4 filed on 2015 Apr. 14; CN 201510155807.7 filed on 2015 Apr. 3; CN 201510193980.6 filed on 2015 Apr. 22; CN 201510372375.5 filed on 2015 Jun. 26; CN 201510259151.3 filed on 2015 May 19; CN 201510268927.8 filed on 2015 May 22; CN 201510284720.x filed on 2015 May 29; CN 201510338027.6 filed on 2015 Jun. 17; CN 201510315636.x filed on 2015 Jun. 10; CN 201510373492.3 filed on 2015 Jun. 26; CN 201510364735.7 filed on 2015 Jun. 26; CN 201510378322.4 filed on 2015 Jun. 29; CN 201510391910.1 filed on 2015 Jul. 2; CN 201510406595.5 filed on 2015 Jul. 10; CN 201510482944.1 filed on 2015 Aug. 7; CN 201510486115.0 filed on 2015 Aug. 8; CN 201510428680.1 filed on 2015 Jul. 20; CN 201510483475.5 filed on 2015 Aug. 8; CN 201510555543.4 filed on 2015 Sep. 2; CN 201510557717.0 filed on 2015 Sep. 6; CN 201510595173.7 filed on 2015 Sep. 18; CN 201510724263.1 filed on 2015 Oct. 29; and CN 201510726365.7 filed on 2015 Oct. 30, the disclosures of which are incorporated herein in their entirety by reference. This application is also a continuation application of U.S. application Ser. No. 15/211,783 filed on Jul. 15, 2016 which is a continuation-in-part application of U.S. application Ser. No. 14/865,387 filed on Sep. 25, 2015, the disclosures of which are incorporated herein in their entirety by reference.

FIELD OF THE INVENTION

The present disclosure relates to illumination devices, and more particularly to an LED tube lamp and its components including the light sources, electronic components, and end caps.

BACKGROUND

LED lighting technology is rapidly developing to replace traditional incandescent and fluorescent lightings. LED tube lamps are mercury-free in comparison with fluorescent tube lamps that need to be filled with inert gas and mercury. Thus, it is not surprising that LED tube lamps are becoming a highly desired illumination option among different available lighting systems used in homes and workplaces, which used to be dominated by traditional lighting options such as compact fluorescent light bulbs (CFLs) and fluorescent tube lamps. Benefits of LED tube lamps include improved durability and longevity and far less energy consumption; therefore, when taking into account all factors, they would typically be considered as a cost effective lighting option.

The white light with 3000K-5000K color temperature for LED tube lamps has been widely used. Among them, the LED tube lamps with a diameter of ⅝ inch or 1 inch and a length of 2 ft, 4 ft or 8 ft are the most commonly used. Typical LED tube lamps have a heat sink made of aluminum metal, an LED circuit board disposed on the heat sink with light sources being mounted on the circuit board, and end caps provided at two ends of the lamp tube. The LED circuit board is affixed on an upper surface of the heat sink through an adhesive, so heat generated from the LED light sources can be conducted through the LED circuit board and the adhesive to the heat sink. Therefore, the adhesive is usually a thermally conductive or non-insulating adhesive, such as a silicon adhesive. The lamp tube is usually a glass tube or plastic tube with good thermal conductivity to improve heat dissipating. The LED circuit board electrically connects to a connector, e.g. including a connecting pin, on the end cap. The connector is suitable for physical and electrical connecting with a traditional lamp holder or light fixture designed for fluorescent tube lamps. In addition, typically the LED tube lamp further comprises a power supply which is suitable for receiving signals from a lamp holder or light fixture. The power supply comprises voltage and current regulating circuits and generates a driving signal that can drive LED light sources. However, existing LED tube lamps have certain drawbacks. For example, metallic heat sinks are usually heavy, which will increase the overall weight of the LED tube lamp a lot, and is unfavorable for assembly and increases difficulty in mass production. In addition, the electrical components and fuses in the LED tube lamps may not perform properly due to increasing temperature inside the LED tube lamps during the use of the LED tube lamps. Specifically, the fuses very likely incorrectly cause open circuits in response to high environmental temperatures inside the LED tube lamps instead of high electrical current flow. The electrical components operate in unexpected ways which are different from circuit design.

Grainy visual appearances are also often found in the aforementioned conventional LED tube lamp. The LED light sources spatially arranged on the circuit board inside the lamp tube are considered as spot light sources, and the lights emitted from these LED light sources generally do not contribute uniform illuminance for the LED tube lamp without proper optical manipulation. As a result, the entire tube lamp would exhibit a grainy or non-uniform illumination effect to a viewer of the LED tube lamp, thereby negatively affecting the visual comfort and even narrowing the viewing angles of the lights. As a result, the quality and aesthetics requirements of average consumers would not be satisfied. To address this issue, the Chinese patent application with application no. CN 201320748271.6 discloses a diffusion tube is disposed inside a glass lamp tube to avoid grainy visual effects. Siemiet (US 20090161359 and US 20090219713) discloses covering a diffusing film (PET film, polyethylene terephthalate) on the interior or exterior surface of lamp tube. PET is also a heat-shrinkable material and can protect glass lamp tubes.

Accordingly, the prevent disclosure and its embodiments are herein provided.

SUMMARY OF THE INVENTION

It's especially noted that the present disclosure may actually include one or more inventions claimed currently or not yet claimed, and for avoiding confusion due to unnecessarily distinguishing between those possible inventions at the stage of preparing the specification, the possible plurality of inventions herein may be collectively referred to as "the (present) invention" herein.

Various embodiments are summarized in this section and are described with respect to the "present invention," which terminology is used to describe certain presently disclosed embodiments, whether claimed or not, and is not necessarily an exhaustive description of all possible embodiments, but rather is merely a summary of certain embodiments. Certain of the embodiments described below as various aspects of the "present invention" can be combined in different manners to form an LED tube lamp or a portion thereof.

The present invention provides a novel LED tube lamp, and aspects thereof.

According to some embodiments, an LED tube lamp comprises a glass tube, two end caps, an LED light strip inside the glass tube, a plurality of LED light sources on the LED light strip, a power supply module and an adhesive. The glass tube comprises a main body with an outer surface and two rear end regions respectively at two ends of the main body. The outer diameter of each of the rear end regions is less than that of the main body. Each of the end caps comprises a tubular wall sleeving over the respective rear end region and an end wall substantially perpendicular to the axial direction of the tubular wall and connected to an end of the tubular wall. The diameter of the outer surface of the main body is substantially the same as the diameter of the outer surface of the tubular wall. The LED light strip attaches to an inner circumferential surface of the glass tube. The power supply, comprises a rectifying circuit and a filtering circuit, is configured to drive the plurality of LED light sources. The adhesive is disposed between each of the inner surface of the tubular wall and the outer surface of each of the rear end regions.

According to some embodiments, an LED tube lamp comprises a glass tube, two end caps, an LED light strip inside the glass tube, a plurality of LED light sources on the LED light strip, a power supply module and an adhesive. The glass tube comprises a main body with an outer surface and two rear end regions respectively at two ends of the main body. The outer diameter of each of the rear end regions is less than that of the main body. Each of the end caps comprises a tubular wall sleeving over the respective rear end region and an end wall substantially perpendicular to the axial direction of the tubular wall and connected to an end of the tubular wall. The diameter of the outer surface of the main body is substantially the same as the diameter of the outer surface of the tubular wall. The LED light strip attaches to an inner circumferential surface of the glass tube. The power supply, comprises a rectifying circuit and a filtering circuit, is configured to drive the plurality of LED light sources. The adhesive is disposed between each of the inner surface of the tubular wall and the outer surface of each of the rear end regions.

According to some embodiments, the power supply module comprises a circuit board. The circuit board comprises a first surface and a second surface opposite to and substantially parallel with each other. The first surface and the second surface of the circuit board are substantially parallel with the axial direction of the tubular wall. The circuit board comprises two soldering pads arranged on the first surface and the circuit board electrically connects to the LED light strip via the two soldering pads.

According to some embodiments, the circuit board is stacked with an end of the LED light strip.

According to some embodiments, the circuit board is stacked with an end of the LED light strip in one of the rear end regions.

According to some embodiments, the power supply module comprises at least one of a transistor and an integrated circuit mounted on the second surface of the circuit board.

According to some embodiments, the rectifying circuit comprises four rectifying diodes configured to full-wave rectify a received signal and generate a rectified signal.

According to some embodiments, the rectifying circuit has a first input terminal electrically connected to a first pin disposed on one of the two end caps and a second input terminal electrically connected to a second pin disposed on the other one of the two end caps. The rectifying circuit produces a rectified signal between a first rectifying output terminal and a second rectifying output terminal.

According to some embodiments, the filtering circuit is configured to generate a filtered signal based on the rectified signal and comprises a first capacitor, a first inductor and a second capacitor. The first capacitor has an end electrically connected to the rectifying circuit to receive the rectified signal. The first inductor has an end electrically connected to the end of the first capacitor. The second capacitor has an end electrically connected to another end of the first inductor and another end electrically connected to another end of the first capacitor.

According to some embodiments, the filtering circuit comprises a first filtering unit. The first filtering unit electrically connects to the first and the second rectifying output terminals to receive the rectified signal and configures to produce a filtered signal.

According to some embodiments, the first filtering unit comprises a first capacitor. The first capacitor has an end electrically connected to the first rectifying output terminal and the other end electrically connected to the second rectifying output terminal.

According to some embodiments, the filtering circuit comprises a second filtering unit. The second filtering unit electrically connects between the first input terminal and the pin electrically connected to the first input terminal.

According to some embodiments, the second filtering unit comprises an inductor. The inductor has an end connected to the pin disposed on one of the two end caps and the other end connected to the first input terminal.

According to some embodiments, the filtering circuit comprises a third filtering unit. The third filtering unit electrically connects between one of the pins and one of the rectifying diodes of the rectifying circuit.

According to some embodiments, the third filtering unit comprises an EMI-reducing capacitor. The EMI-reducing capacitor connects between the pin disposed on one of the two end caps and the anode of the third rectifying diode.

According to some embodiments, the power supply module comprises a driving circuit. The driving circuit electrically connects to the filtering circuit to receive the filtered signal and performs power conversion for converting the filtered signal into a driving signal at driving output terminals electrically connected to the LED light strip. According to some embodiments, the driving circuit comprises a switch, a controller, a second inductor and a diode. The switch has a first terminal, a second terminal and a control terminal. The controller electrically connects to the control terminal for controlling current conduction between the first and second terminals. The second inductor has an end electrically connected to the first terminal of the switch and another end electrically connected to one of the driving output terminals. The diode has an anode electrically connected to the end of the second inductor and a cathode electrically connected to another one of the driving output terminals.

According to some embodiments, power supply module comprises an anti-flickering circuit. The anti-flickering circuit electrically connects between the filtering circuit and the driving circuit and configured to consume partial energy of the filtered signal so as to reduce ripples of the filtered signal.

According to some embodiments, the anti-flickering circuit comprises at least a resistor electrically connected between output terminals of the filtering circuit.

DETAILED DESCRIPTION

Figure 1:
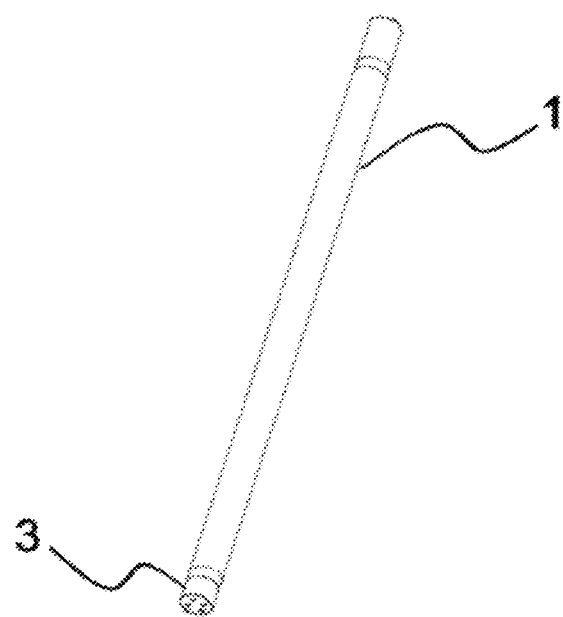
FIG. 1 is a perspective view schematically illustrating an LED tube lamp according to one embodiment of the present invention.

The present disclosure provides a novel LED tube lamp. The present disclosure will now be described in the following embodiments with reference to the drawings. The following descriptions of various embodiments of this invention are presented herein for purpose of illustration and giving examples only. It is not intended to be exhaustive or to be limited to the precise form disclosed. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of components may be exaggerated for clarity. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers, or steps, these elements, components, regions, layers, and/or steps should not be limited by these terms. Unless the context indicates otherwise, these terms are only used to distinguish one element, component, region, layer, or step from another element, component, region, or step, for example as a naming convention. Thus, a first element, component, region, layer, or step discussed below in one section of the specification could be termed a second element, component, region, layer, or step in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to direct contact (i.e., touching) unless the context indicates otherwise.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Terms such as "about" or "approximately" may reflect sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) is not electrically connected to that component. Moreover, items that are "directly electrically connected," to each other are electrically connected through one or more passive elements, such as, for example, wires, pads, internal electrical lines, resistors, etc. As such, directly electrically connected components do not include components electrically connected through active elements, such as transistors or diodes.

Components described as thermally connected or in thermal communication are arranged such that heat will follow a path between the components to allow the heat to transfer from the first component to the second component. Simply because two components are part of the same device or board does not make them thermally connected. In general, components which are heat-conductive and directly connected to other heat-conductive or heat-generating components (or connected to those components through intermediate heat-conductive components or in such close proximity as to permit a substantial transfer of heat) will be described as thermally connected to those components, or in thermal communication with those components. On the contrary, two components with heat-insulative materials therebetween, which materials significantly prevent heat transfer between the two components, or only allow for incidental heat transfer, are not described as thermally connected or in thermal communication with each other. The terms "heat-conductive" or "thermally-conductive" do not apply to any material that provides incidental heat conduction, but are intended to refer to materials that are typically known as good heat conductors or known to have utility for transferring heat, or components having similar heat conducting properties as those materials.

Figure 2:
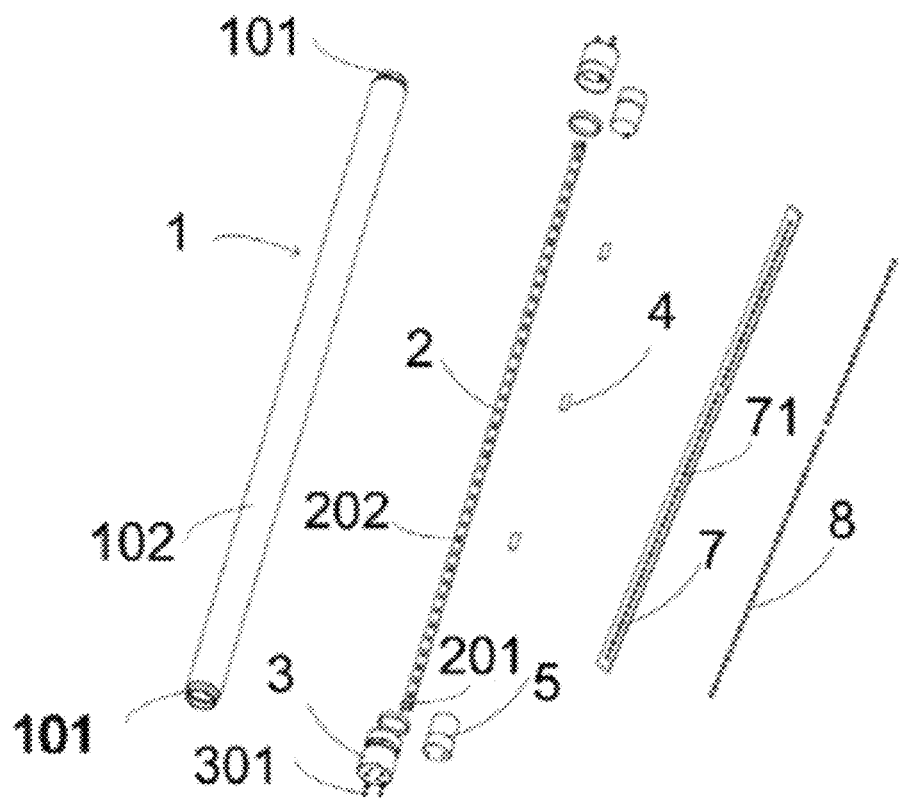
FIG. 2 is an exemplary exploded view schematically illustrating the LED tube lamp shown in FIG. 1.

Referring to FIGS. 1 and 2, an LED tube lamp of one embodiment of the present invention includes a lamp tube 1, an LED light strip 2 disposed inside the lamp tube 1, and two end caps 3 respectively disposed at two ends of the lamp tube 1. The lamp tube 1 may be made of plastic or glass. The lengths of the two end caps 3 may be same or different.

In one embodiment, the lamp tube 1 is made of glass with strengthened or tempered structure to avoid being easily broken and incurring electrical shock occurred to conventional glass made tube lamps, and to avoid the fast aging process that often occurs in plastic made tube lamps. The glass made lamp tube 1 may be additionally strengthened or tempered by a chemical tempering method or a physical tempering method in various embodiments of the present invention.

Figure 4:
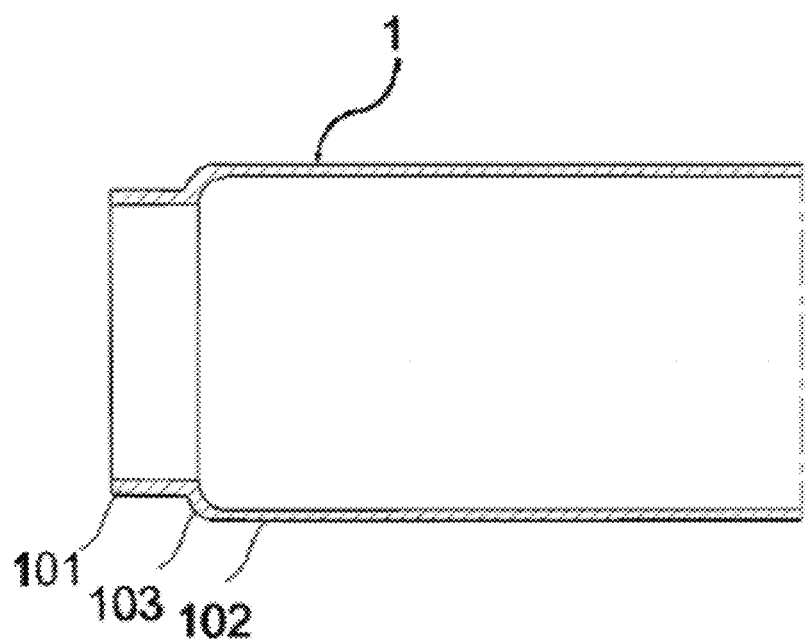
FIG. 4 is a plane cross-sectional view schematically illustrating an end structure of a lamp tube of the LED tube lamp according to one embodiment of the present invention.

Referring to FIG. 2 and FIG. 4, a glass made lamp tube of an LED tube lamp according to one embodiment of the present invention has structure-strengthened end regions described as follows. The glass made lamp tube 1 includes a main body region 102, two rear end regions 101 (or just end regions 101) respectively formed at two ends of the main body region 102, and end caps 3 that respectively sleeve the rear end regions 101. The outer diameter of at least one of the rear end regions 101 is less than the outer diameter of the main body region 102. In the embodiment of FIGS. 2 and 4, the outer diameters of the two rear end regions 101 are less than the outer diameter of the main body region 102. In addition, the surface of the rear end region 101 is in parallel with the surface of the main body region 102 in a cross-sectional view. Specifically, the glass made lamp tube 1 is strengthened at both ends, such that the rear end regions 101 are formed to be strengthened structures. In certain embodiments, the rear end regions 101 with strengthened structure are respectively sleeved with the end caps 3, and the outer diameters of the end caps 3 and the main body region 102 have little or no differences. For example, the end caps 3 may have the same or substantially the same outer diameters as that of the main body region 102 such that there is no gap between the end caps 3 and the main body region 102. In this way, a supporting seat in a packing box for transportation of the LED tube lamp contacts not only the end caps 3 but also the lamp tube 1 and makes uniform the loadings on the entire LED tube lamp to avoid situations where only the end caps 3 are forced, therefore preventing breakage at the connecting portion between the end caps 3 and the rear end regions 101 due to stress concentration. The quality and the appearance of the product are therefore improved.

In one embodiment, the end caps 3 and the main body region 102 have substantially the same outer diameters. These diameters may have a tolerance for example within +/−0.2 millimeter (mm), or in some cases up to +/−1.0 millimeter (mm). Depending on the thickness of the end caps 3, the difference between an outer diameter of the rear end regions 101 and an outer diameter of the main body region 102 can be about 1 mm to about 10 mm for typical product applications. In some embodiments, the difference between the outer diameter of the rear end regions 101 and the outer diameter of the main body region 102 can be about 2 mm to about 7 mm.

Referring to FIG. 4, the lamp tube 1 is further formed with a transition region 103 between the main body region 102 and the rear end regions 101. In one embodiment, the transition region 103 is a curved region formed to have cambers at two ends to smoothly connect the main body region 102 and the rear end regions 101, respectively. For example, the two ends of the transition region 103 may be arc-shaped in a cross-section view along the axial direction of the lamp tube 1. Furthermore, one of the cambers connects the main body region 102 while the other one of the cambers connects the rear end region 101. In some embodiments, the arc angle of the cambers is greater than 90 degrees while the outer surface of the rear end region 101 is a continuous surface in parallel with the outer surface of the main body region 102 when viewed from the cross-section along the axial direction of the lamp tube. In certain embodiments, the length of the transition region 103 along the axial direction of the lamp tube 1 is between about 1 mm to about 4 mm. Upon experimentation, it was found that when the length of the transition region 103 along the axial direction of the lamp tube 1 is less than 1 mm, the strength of the transition region would be insufficient; when the length of the transition region 103 along the axial direction of the lamp tube 1 is more than 4 mm, the main body region 102 would be shorter and the desired illumination surface would be reduced, and the end caps 3 would be longer and the more materials for the end caps 3 would be needed.

Taking the standard specification for T8 lamp as an example, the outer diameter of the rear end region 101 is configured between 20.9 mm to 23 mm. An outer diameter of the rear end region 101 is less than 20.9 mm would be too small to fittingly insert the power supply into the lamp tube 1. The outer diameter of the main body region 102 is in some embodiments configured to be between about 25 mm to about 28 mm. An outer diameter of the main body region 102 being less than 25 mm would be inconvenient to strengthen the ends of the main body region 102 as far as the current manufacturing skills are concerned, while an outer diameter of the main body region 102 being greater than 28 mm is not compliant to the industrial standard.

Figure 3:
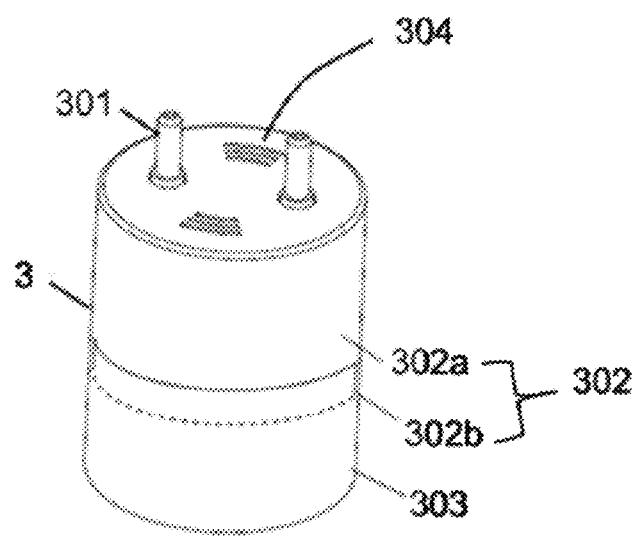
FIG. 3 is a perspective view schematically illustrating a front and top of an end cap of the LED tube lamp according to one embodiment of the present invention.

Referring to FIGS. 2 and 3, in one embodiment, the end cap 3 may have openings 304 to dissipate heat generated by the power supply modules inside the end cap 3 so as to prevent a high temperature condition inside the end cap 3 that might reduce reliability. The openings 304 promote the convection of the hot air inside the lamp tube and the cold air outside the lamp tube to increase the heat dissipation of the LED tube lamp and keep the inner space of the lamp tube full of ambient atmosphere.

Referring again to FIG. 2, the LED tube lamp according to some embodiments of the present invention also includes an adhesive sheet 4, an insulation adhesive sheet 7, and an optical adhesive sheet 8. The LED light strip 2 is fixed by the adhesive sheet 4 to an inner circumferential surface of the lamp tube 1. Heat generated by the LED light sources can quickly be conducted through the adhesive sheet 4 to the lamp tube. The adhesive sheet 4 may be but is not limited to a silicone adhesive, as long as it is not insulated. The adhesive sheet 4 may be in form of several short pieces or a long piece. Various kinds of the adhesive sheet 4, the insulation adhesive sheet 7, and the optical adhesive sheet 8 can be combined to constitute various embodiments of the present invention.

The insulation adhesive sheet 7 is coated on the surface of the LED light strip 2 that faces the LED light sources 202 so that the LED light strip 2 is not exposed and thus is electrically insulated from the outside environment. In application of the insulation adhesive sheet 7, a plurality of through holes 71 on the insulation adhesive sheet 7 are reserved to correspondingly accommodate the LED light sources 202 such that the LED light sources 202 are mounted in the through holes 71.

The optical adhesive sheet 8, which is a clear or transparent material, is applied or coated on the surface of the LED light sources 202 in order to ensure optimal light transmittance. After being applied to the LED light sources 202, the optical adhesive sheet 8 may have a granular, strip-like or sheet-like shape. The refractive index of the optical adhesive sheet 8 is in some embodiments between 1.22 and 1.6. In some embodiments, the thickness of the optical adhesive sheet 8 may range from 1.1 mm to 1.3 mm. The optical adhesive sheet 8 having a thickness less than 1.1 mm may not be able to cover the LED light sources 202, while the optical adhesive sheet 8 having a thickness more than 1.3 mm may reduce light transmittance and increases material cost.

In some embodiments, in the process of assembling the LED light sources to the LED light strip, the optical adhesive sheet 8 is first applied on the LED light sources 202; then the insulation adhesive sheet 7 is coated on one side of the LED light strip 2; then the LED light sources 202 are fixed or mounted on the LED light strip 2; the other side of the LED light strip 2 being opposite to the side of mounting the LED light sources 202 is bonded and affixed to the inner surface of the lamp tube 1 by the adhesive sheet 4; finally, the end cap 3 is fixed to the end portion of the lamp tube 1, and the LED light sources 202 and the power supply 5 are electrically connected by the LED light strip 2.

In this embodiment, the LED light strip 2 is fixed by the adhesive sheet 4 to an inner circumferential surface of the lamp tube 1, so as to increase the light illumination angle of the LED tube lamp and broaden the viewing angle to be greater than 330 degrees. By means of applying the insulation adhesive sheet 7 and the optical adhesive sheet 8, electrical insulation of the entire light strip 2 is accomplished such that electrical shock would not occur even when the lamp tube 1 is broken and therefore safety could be improved.

Furthermore, the inner surface of the glass made lamp tube 1 may be covered or coated with an adhesive film (not shown) to isolate the inside from the outside of the glass made lamp tube 1 when the glass made lamp tube 1 is broken. In this embodiment, the adhesive film is coated on the inner surface of the lamp tube 1. The material for the coated adhesive film includes, for example, methyl vinyl silicone oil, hydro silicone oil, xylene, and calcium carbonate, wherein xylene is used as an auxiliary material. The xylene will be volatilized and removed when the coated adhesive film on the inner surface of the lamp tube 1 solidifies or hardens. The xylene is mainly used to adjust the capability of adhesion and therefore to control the thickness of the coated adhesive film.

In one embodiment, the thickness of the coated adhesive film is preferably between about 100 and about 140 micrometers ($\mu$m). The adhesive film having a thickness being less than 100 micrometers may not have sufficient shatterproof capability for the glass tube, and the glass tube is thus prone to crack or shatter. The adhesive film having a thickness being larger than 140 micrometers may reduce the light transmittance and also increase material cost.

In one embodiment, the inner circumferential surface of the glass made lamp tube 1 is coated with an adhesive film such that the broken pieces are adhered to the adhesive film when the glass made lamp tube is broken. Therefore, the lamp tube 1 would not be penetrated to form a through hole connecting the inside and outside of the lamp tube 1 and thus prevents a user from touching any charged object inside the lamp tube 1 to avoid electrical shock. In addition, the adhesive film is able to diffuse light and allows the light to transmit such that the light uniformity and the light transmittance of the entire LED tube lamp increases. The adhesive film can be used in combination with the adhesive sheet 4, the insulation adhesive sheet 7 and the optical adhesive sheet 8 to constitute various embodiments of the present invention.

Furthermore, the light strip 2 may be an elongated aluminum plate or aluminum alloy plate, FR 4 board (polycarbonate), or a bendable circuit sheet.

Referring to FIG. 2, in one embodiment, the LED light strip 2 has a plurality of LED light sources 202 mounted thereon, and the end cap 3 has a power supply 5 installed therein. The LED light sources 202 and the power supply 5 are electrically connected by the LED light strip 2. The power supply 5 may be a single integrated unit (i.e., all of the power supply components are integrated into one module unit) installed in one end cap 3. Alternatively, the power supply 5 may be divided into two separate units (i.e. the power supply components are divided into two parts) installed in two end caps 3, respectively. When only one end of the lamp tube 1 is strengthened by a glass tempering process, it may be preferable that the power supply 5 is a single integrated unit and installed in the end cap 3 corresponding to the strengthened end of the lamp tube 1.

In another embodiment, the connection between the power supply 5 and the LED light strip 2 may be accomplished via tin soldering, rivet bonding, or welding. One way to secure the LED light strip 2 is to provide the adhesive sheet 4 at one side thereof and adhere the LED light strip 2 to the inner surface of the lamp tube 1 via the adhesive sheet 4.

In one embodiment, the LED light strip 2 comprises a hard circuit board made of aluminum and the power supply 5 is solder bonded to one of the ends or terminals of the hard circuit board to save space in the longitudinal direction used for the end cap. This solder bonding technique may be more convenient to accomplish and the effective illuminating areas of the LED tube lamp could also remain. In one embodiment, at least some of the electronic components of power supply module are disposed on a light strip of the LED tube lamp. In one embodiment, all electronic components of the power supply module are disposed on the light strip.

In certain embodiments, if all electronic components of the power supply module are disposed on the light strip, electrical connection between terminal pins of the LED tube lamp and the light strip may be achieved by connecting the pins to conductive lines which are soldered with ends of the light strip. In this case, another substrate for supporting the power supply module is not required, thereby allowing an improved design or arrangement in the end cap(s) of the LED tube lamp. In some embodiments, (components of) the power supply module are disposed at two ends of the light strip, in order to significantly reduce the impact of heat generated from the power supply module's operations on the LED components. Since no substrate other than the light strip is used to support the power supply module in this case, the total amount of or soldering can be significantly reduced, improving the general reliability of the power supply module.

The LED light strip 2 with the plurality of LED light sources 202 and power supply 5 are in the lamp tube 1. In other words, all the electronic components of the power supply 5 are on the light strip 2. Each of the end caps 3 comprises two conductive pins 301 for receiving an external driving signal. The electrical connection between the LED light strip 2 and the pins 301 may be achieved by wire bonding.

Power supply may be otherwise referred to as a power conversion module/circuit or power module, and encompass the conventional meanings of the term "power supply" commonly understood by one of ordinary skill in the art, including a meaning of "a circuit that converts ac line voltage to dc voltage and supplies power to the LED or LED module". They are called a "power supply" herein as they are for supplying or providing power, from external signal(s) as from AC powerline or a ballast, to the LED module.

The above-mentioned features of the present invention can be accomplished in any combination to improve the LED tube lamp, and the above embodiments are described by way of example only. The present invention is not herein limited, and many variations are possible without departing from the spirit of the present invention and the scope as defined in the appended claims.

What is claimed is:

1. An LED tube lamp, comprising:
a heat-dissipating glass lamp tube;
a protective film attached to a surface of the glass lamp tube;
an LED light strip disposed in the glass lamp tube, the LED light strip comprising a substantially flat LED circuit board and a plurality of LED light sources, the LED circuit board comprising a top surface and a base surface, the plurality of LED light sources mounted on the top surface;
a non-insulating adhesive layer disposed between the base surface of the LED circuit board and the curved inner surface of the glass lamp tube and extending along a length of the LED light strip, wherein the base surface is directly affixed to a curved inner surface of the glass lamp tube via the non-insulating adhesive layer; and
two end caps, each of the two end caps coupled to a respective end of the glass lamp tube,
wherein the LED circuit board comprises a first end electrically connecting to a first connector and a second end electrically connecting to a second connector, the first connector and the second connector are connectable to a light fixture through the end caps;
wherein the inner space of the glass lamp tube comprises ambient atmosphere;
wherein the plurality of LED light sources emit white light;
wherein a diameter of the lamp tube is ⅝ inch or 1 inch and a length of the glass lamp tube is 2 ft, 4 ft or 8 ft.

2. The LED tube lamp of claim 1, wherein the LED light strip further comprises a power supply module disposed on the LED circuit board, the power supply module comprises voltage and current regulating circuits to drive the plurality of LED light sources.

3. The LED tube lamp of claim 1, wherein the LED circuit board further comprises a heat-dissipating base at a lower side of the LED circuit board.

4. The LED tube lamp of claim 3, wherein the heat-dissipating base is made of aluminum or aluminum alloy.

5. The LED tube lamp of claim 3, wherein the LED circuit board is made of polycarbonate.

6. The LED tube lamp of claim 1, wherein the non-insulating adhesive layer is silicone adhesive.

7. The LED tube lamp of claim 1, wherein the LED circuit board is made of aluminum or aluminum alloy.

8. The LED tube lamp according to claim 1, wherein the protective film is a heat-shrinking film attached to an exterior surface of the glass lamp tube.

9. The LED tube lamp according to claim 8, wherein the heat-shrinking film is made of polyethylene terephthalate.

10. A method of making an LED tube lamp, comprising the steps of:
providing a heat-dissipating glass lamp tube;
attaching a protective film to a surface of the glass lamp tube;
affixing a base surface of an LED light strip directly to a curved inner surface of the glass lamp tube with a non-insulating adhesive layer extending along a length of the LED light strip, wherein the LED light strip comprises an LED circuit board and a plurality of LED light sources mounted on a top surface of the LED circuit board;
electrically connecting a first end of the LED circuit board to a first connector and electrically connecting a second end of the LED circuit board to a second connector; and
coupling each one of two end caps to a respective end of the glass lamp tube, wherein the first connector and second connector are connectable to a light fixture through the end caps,
wherein the inner space of the glass lamp tube comprises ambient atmosphere,
wherein the plurality of LED light sources emit white light,
wherein a diameter of the lamp tube is ⅝ inch or 1 inch and a length of the lamp tube is 2 ft, 4 ft or 8 ft.

11. The method of making an LED tube lamp according to claim 10, wherein the non-insulating adhesive layer is silicone adhesive.

12. A method of providing heat-dissipation without a heat sink in an LED tube lamp, comprising the steps of:
providing a heat-dissipating glass lamp tube;
attaching a protective film to a surface of the glass lamp tube;
affixing a base surface of an LED light strip directly to a curved inner surface of the glass lamp tube with a non-insulating adhesive layer extending along a length of the LED light strip, wherein the LED light strip comprises an LED circuit board and a plurality of LED light sources mounted on a top surface of the LED circuit board;
electrically connecting a first end of the LED circuit board to a first connector and electrically connecting a second end of the LED circuit board to a second connector;
coupling each one of two end caps to a respective end of the glass lamp tube, wherein the first connector and second connector are connectable to a light fixture through the end caps; and
dissipating heat through the glass lamp tube,
wherein the inner space of the glass lamp tube comprises ambient atmosphere,
wherein the plurality of LED light sources emit white light,
wherein a diameter of the lamp tube is ⅝ inch or 1 inch and a length of the lamp tube is 2 ft, 4 ft or 8 ft.

* * * * *